United States Patent
Lee

(10) Patent No.: US 8,942,048 B2
(45) Date of Patent: Jan. 27, 2015

(54) SEMICONDUCTOR DEVICE AND METHOD OF OPERATING THE SAME

(71) Applicant: SK Hynix Inc., Icheon-si, Gyeonggi-do (KR)

(72) Inventor: Hee Youl Lee, Gyeonggi-do (KR)

(73) Assignee: SK Hynix Inc., Icheon-Si, Gyeonggi-Do (KR)

( * ) Notice: Subject to any disclaimer, the term of this patent is extended or adjusted under 35 U.S.C. 154(b) by 0 days.

(21) Appl. No.: 14/041,668

(22) Filed: Sep. 30, 2013

(65) Prior Publication Data

US 2014/0347937 A1 Nov. 27, 2014

(30) Foreign Application Priority Data

May 27, 2013 (KR) .................... 10-2013-0059737

(51) Int. Cl.
*G11C 16/10* (2006.01)
*G11C 16/12* (2006.01)
*G11C 16/14* (2006.01)

(52) U.S. Cl.
CPC ................ *G11C 16/12* (2013.01); *G11C 16/14* (2013.01)

USPC ............. 365/185.24; 365/185.18; 365/185.33

(58) Field of Classification Search
CPC ....................................................... G11C 16/10
USPC ...................................................... 365/185.24
See application file for complete search history.

(56) References Cited

U.S. PATENT DOCUMENTS 7,590,005 B2 * 9/2009 Hsu et al. ................. 365/185.24
7,808,818 B2 * 10/2010 Eitan ........................ 365/185.24

FOREIGN PATENT DOCUMENTS

KR 1020050071048 A 7/2005

* cited by examiner

*Primary Examiner* — Son Mai
(74) *Attorney, Agent, or Firm* — Lowe Hauptman & Ham, LLP

(57) ABSTRACT

A semiconductor device includes a memory block coupled to word lines and configured to a memory cell including a floating gate, an inter-poly dielectric and a control gate and a peripheral circuit configured to perform an erase loop operation, a program loop operation an electron injection operation of the memory cell, the electron injection operation trapping electrons in the inter-poly dielectric.

18 Claims, 14 Drawing Sheets

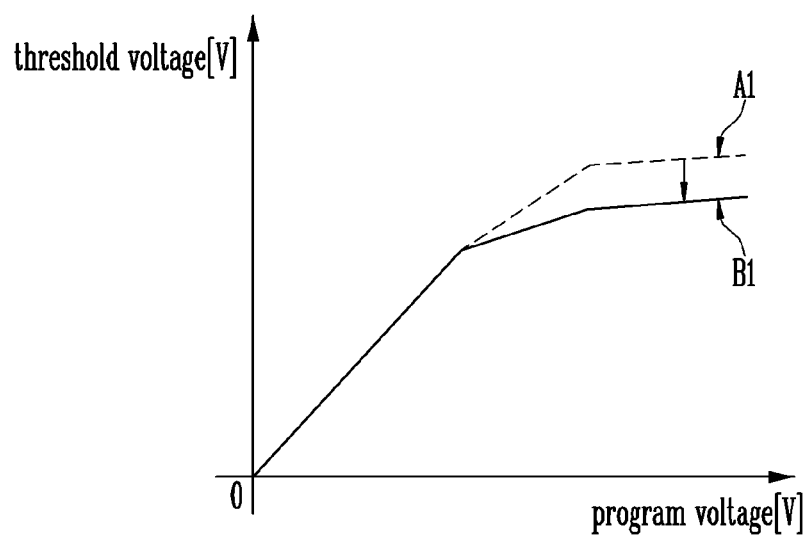

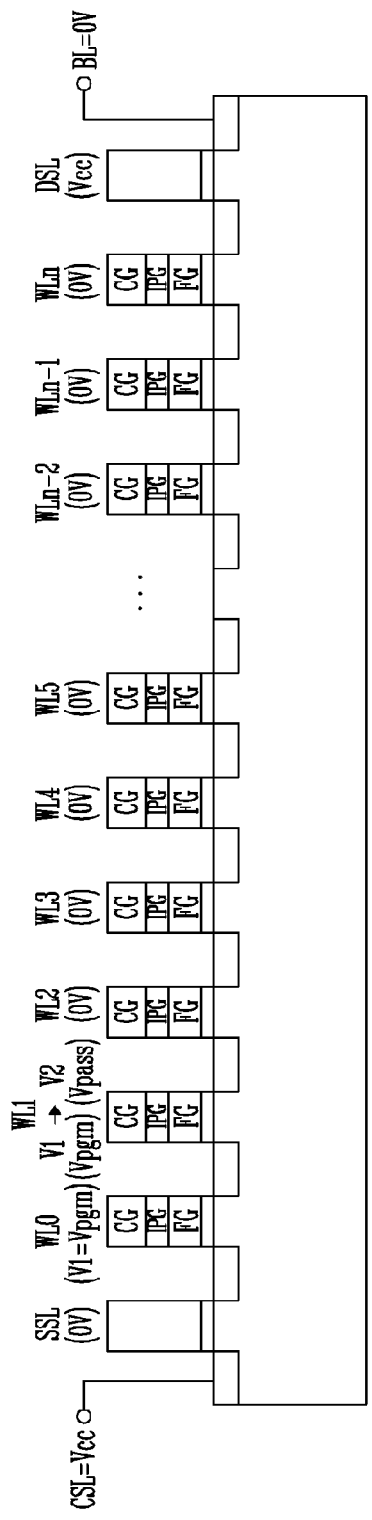
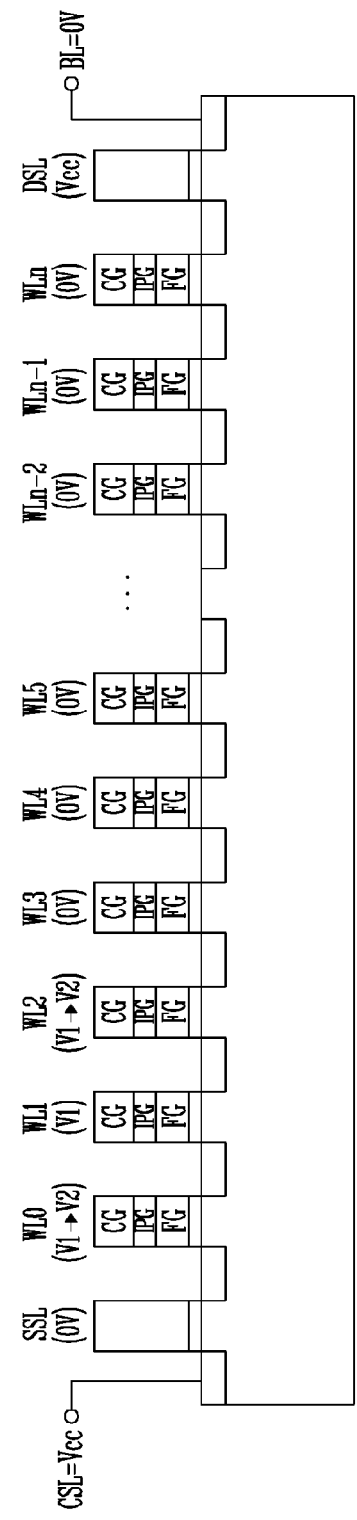

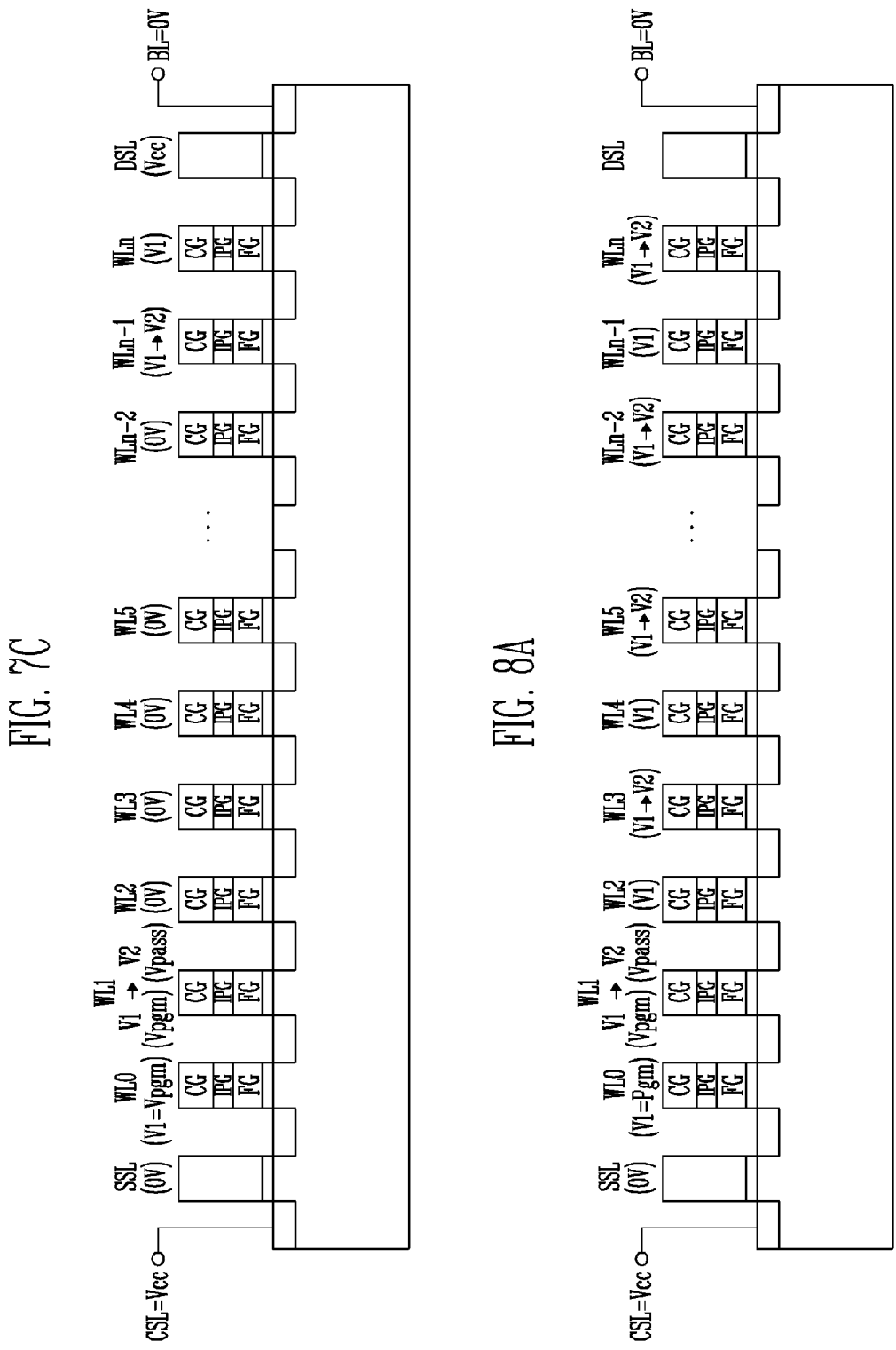

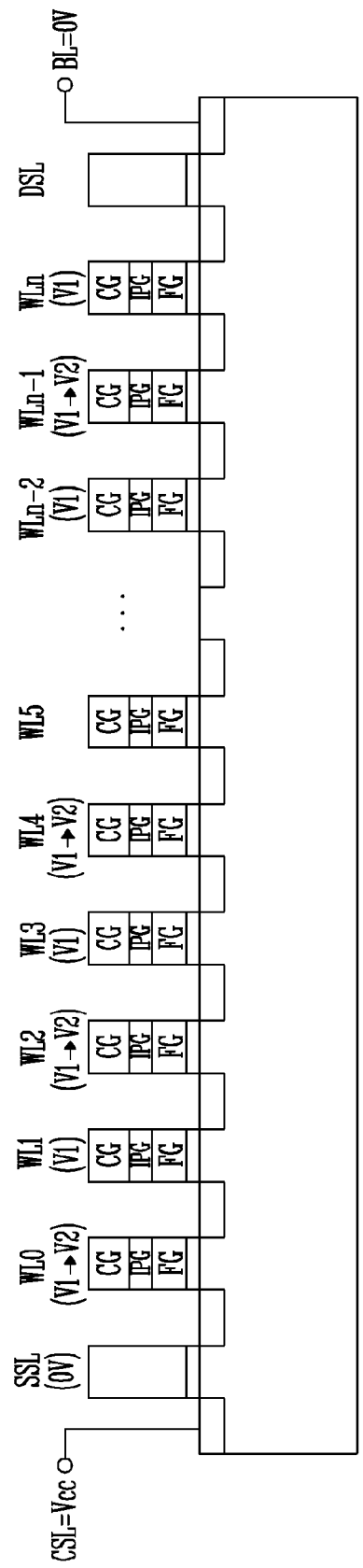

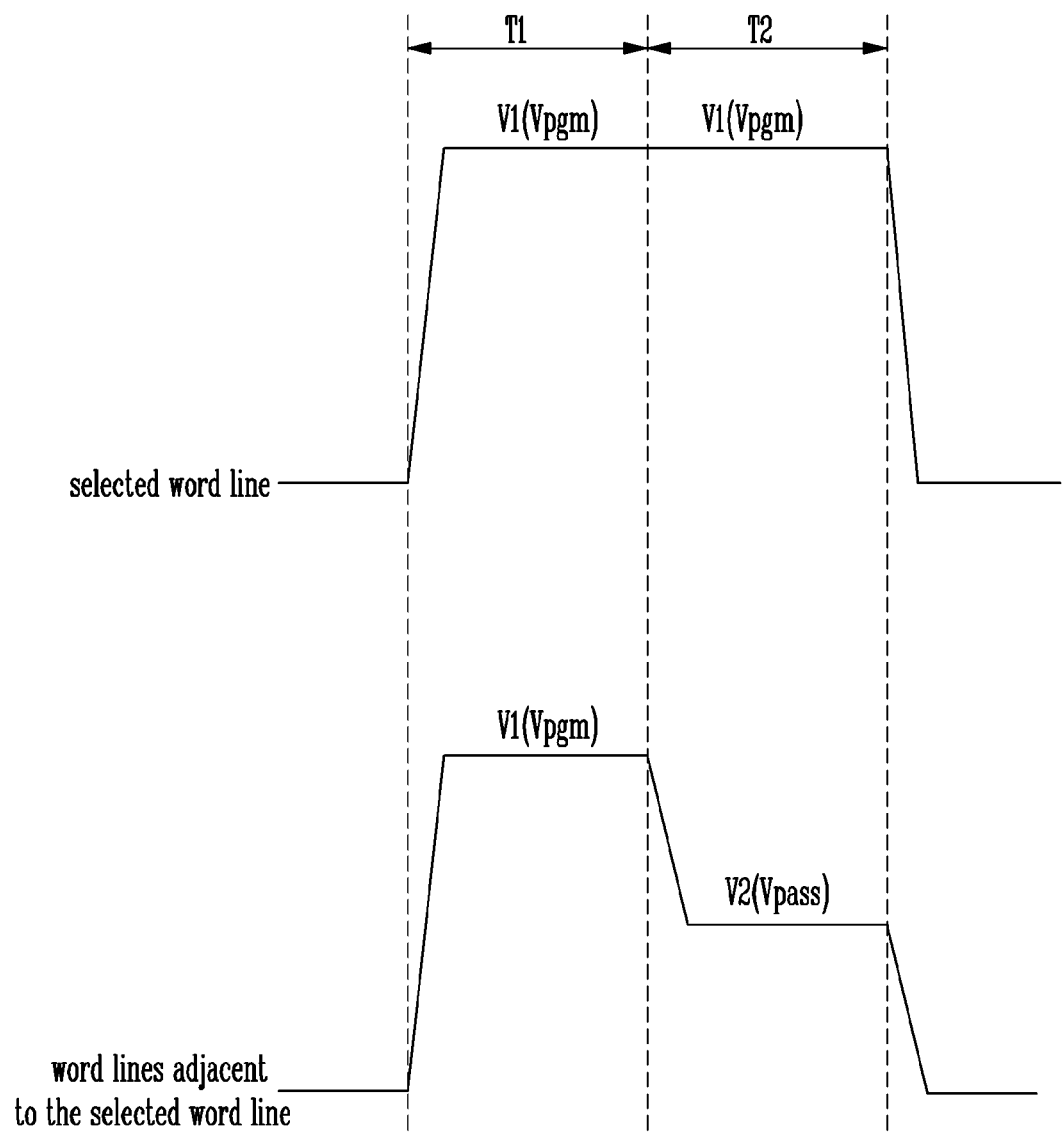

US 8,942,048 B2

SEMICONDUCTOR DEVICE AND METHOD OF OPERATING THE SAME

CROSS-REFERENCE TO RELATED APPLICATION

The present application claims priority to Korean patent application number 10-2013-0059737 filed on May 27, 2013, in the Korean Intellectual Property Office, which is incorporated herein by reference in its entirety.

FIELD

This disclosure relates to a semiconductor device and a method of operating the same, more particularly to a semiconductor device including a memory cell and a method of operating the same.

BACKGROUND

A flash memory device is a representative non-volatile semiconductor memory device, and includes memory blocks. Each of the memory blocks includes memory cells coupled to word lines, and respective memory cells include a tunnel insulation layer, a floating gate, an inter-poly dielectric and a control gate.

A program loop operation including a program operation and a program verification operation is performed based on an increment step pulse programming ISPP method, to store data in the memory cell. An erase loop operation including an erase operation and an erase verification operation is performed through an increment step pulse erasing ISPE method, to erase data.

To reduce a size of a chip, the size of the memory cell is decreased and a space between the memory cells is narrowed. In the event that high program voltage is supplied to control gates of the memory cells when the program operation is performed, electrons injected into the floating gate are discharged to the control gate through the inter-poly dielectric.

SUMMARY

At least one embodiment provides a semiconductor device for enhancing operation characteristics and a method of operating the same.

A method of operating a semiconductor device according to some embodiments includes performing an erase loop operation of a memory cell in a memory block, the memory cell including a floating gate, an inter-poly dielectric and a control gate; performing an electron injection operation of trapping electrons in the inter-poly dielectric of the memory cell; and performing a program loop operation of the memory cell coupled to a word line selected from the memory block.

A semiconductor device according to some embodiments includes a memory block coupled to word lines and configured to include a memory cell including a floating gate, an inter-poly dielectric and a control gate; and a peripheral circuit configured to perform an erase loop operation, a program loop operation, an electron injection operation of the memory cell, the electron injection operation trapping electrons in the inter-poly dielectric.

In some embodiments, a semiconductor device includes enhanced operation characteristics.

BRIEF DESCRIPTION OF THE DRAWINGS

The above and other features and advantages will become readily apparent by reference to the following detailed description when considered in conjunction with the accompanying drawings wherein:

FIG. 4 is a graph of a change of a threshold voltage of the memory cell according to the program voltage according to one or more embodiments;

FIG. 7a to FIG. 7c are views of an electron injection operation of memory cells according to some embodiments FIG. 8a and FIG. 8b are views of an electron injection operation of memory cells according to some embodiments FIG. 9 is a view of a waveform of voltages supplied to the word lines in the electron injection operation according to some embodiments;

DETAILED DESCRIPTION

Hereinafter, the preferred embodiments will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

Figure 1:
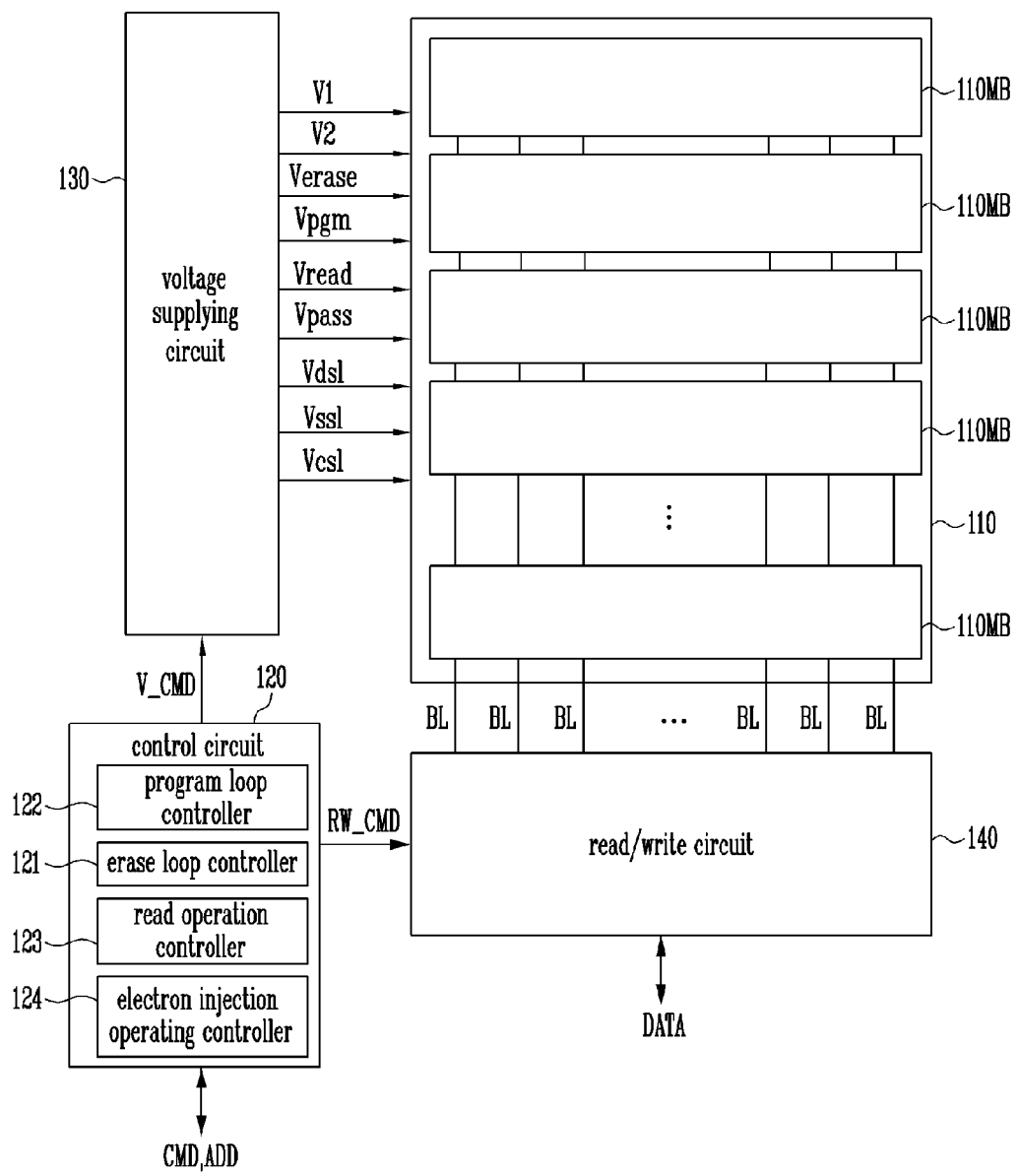
FIG. 1 is a view of retention characteristics of data stored in a memory cell of a semiconductor memory device according to one or more embodiments.

FIG. 1 is a block diagram of a semiconductor device according to some embodiments In FIG. 1, the semiconductor device includes a memory array 110 and a peripheral circuit 120 to 140. The peripheral circuit includes a control circuit 120 and operation circuits 130 and 140.

The memory array 110 includes memory blocks 110MB. Hereinafter, the structure of the memory block 110MB will be described in detail.

Figure 2:
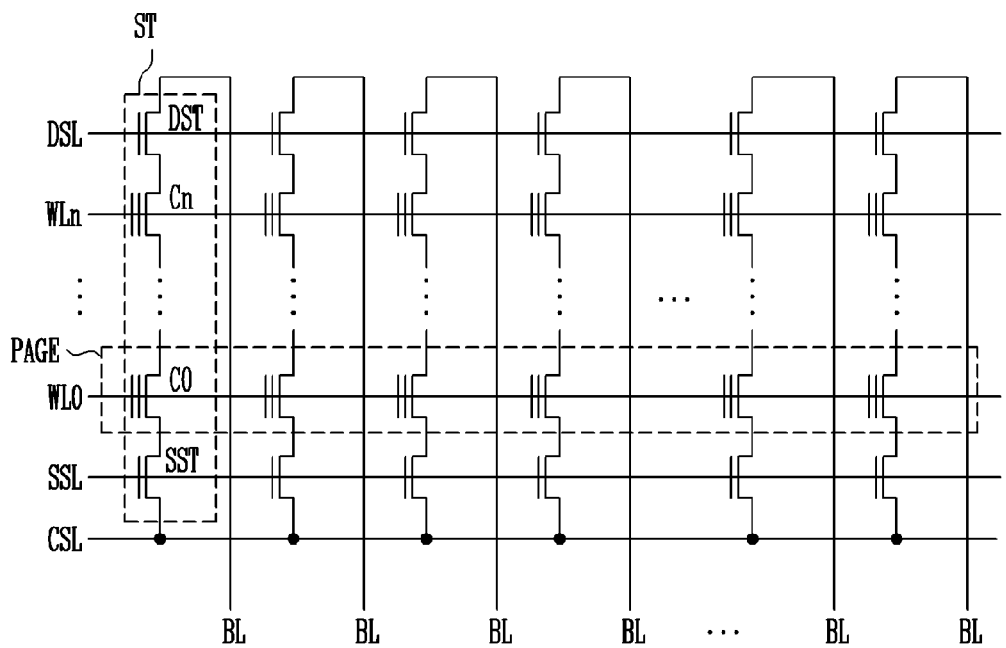
FIG. 2 is a circuit diagram of a memory block in FIG. 1 according to one or more embodiments.

FIG. 2 is a circuit diagram of the memory block 110MB in FIG. 1 according to one or more embodiments.

In FIG. 2, each of the memory blocks includes memory strings ST coupled between bit lines BL and a common source line CSL. The memory strings ST are respectively coupled to the bit lines BL, and are coupled in common to the common source line CSL. Each of the memory strings ST includes a source select transistor SST, a cell string where memory cells C0 to Cn are coupled in series, and a drain select transistor DST. A source of the source select transistor SST is coupled to the common source line CSL, and a drain of the drain select transistor DST is coupled to the bit line BL. The memory cells C0 to Cn in the cell string are coupled in series between the select transistors SST and DST. A gate of the source select transistor SST is coupled to a source select line SSL, gates of the memory cells C0 to Cn are respectively coupled to word lines WL0 to WLn, and a gate of the drain select transistor DST is coupled to a drain select line DSL.

In operation, the drain select transistor DST controls coupling or cutoff between the cell strings C0 to Cn and the bit line BL, and the source select transistor SST controls coupling or cutoff between the cell strings C0 to Cn and the common source line CSL.

Memory cells in a memory cell block of an NAND flash memory device form a physical page or a logical page. For example, memory cells C0 coupled to one word line, e.g. WL0 form one physical page PAGE. Even-numbered memory cells coupled to one word line, e.g. WL0 forms an even physical page, and odd-numbered memory cells form one odd physical page. The page (or the even page and the odd page) is a fundamental unit for a program operation or a read operation.

Referring again to FIG. 1, the peripheral circuit 120 to 140 performs a program loop operation, an erase loop operation, a read operation and an electron injection operation of the memory cells coupled to a selected word line, e.g. WL0. The peripheral circuit includes a control circuit 120 for controlling the program loop operation, the erase loop operation, the read operation and the electron injection operation and operation circuits 130 to 140 for performing the program loop operation, the erase loop operation, the read operation and the electron injection operation in response to control of the control circuit 120. To perform the program loop operation, the erase loop operation, the read operation and the electron injection operation, the operation circuit 130 to 140 outputs selectively operation voltages V1, V2, Verase, Vpgm, Vread, Vpass, Vdsl, Vssl and Vcsl to local lines SSL, WL0~WLn and DSL and the common source line CSL of the selected memory block, and controls precharging/discharging of the bit lines BL or senses current flow of the bit lines BL.

The operation circuit in the NAND flash memory device includes a voltage supplying circuit 130 and a read/write circuit 140. Hereinafter, the circuits 130 and 140 will be described in detail.

The control circuit 120 outputs a voltage control signal V_CMD for controlling the voltage supplying circuit 130, to generate the operation voltages Verase, Vpgm, Vread, Vpass, Vdsl, Vssl and Vcsl for performing the program loop operation, the erase loop operation and the read operation with desired level in response to a command signal PGMs and PGMe inputted from an outside device. The control circuit 120 outputs control signals RW_CMD for controlling a read circuit, a write circuit (or page buffers) in the read/write circuit 140, to perform the program loop operation, the erase loop operation and the read operation. The control circuit 120 generates a column address signal and a row address signal in the event that an address signal ADD is inputted. Here, the selected memory block and a selected word line are determined according to a row address, and an operation voltage supplied to the selected word line is different from that supplied to unselected word lines.

The control circuit 120 includes an erase loop controller 121, a program loop controller 122 and a read operation controller 123. The program loop controller 122 controls the operation circuits 130 and 140 to facilitate the program loop operation including a program operation and a program verification operation through an increment step pulse programming (ISPP) method. The erase loop controller 121 controls the operation circuits 130 and 140 to facilitate the erase loop operation including an erase operation and an erase verification operation through an increment step pulse erasing (ISPE) method.

The control circuit 120 further includes an electron injection operating controller 124 for controlling an electron injection operation of trapping electrons in an inter-poly dielectric of the memory cell. A first voltage V1 is supplied to the selected word line of the memory block and a second voltage V2 is supplied to word lines adjacent to the selected word line after the first voltage V1 is supplied to the word lines, according to control of the electron injection operating controller 124. Here, the first voltage V1 corresponds to a program voltage Vpgm or an erase voltage Verase, and the second voltage V2 corresponds to a program pass voltage Vpass. Since the electrons are trapped in the inter-poly dielectric by the electron injection operation, the electron injection operation is different from the program operation of injecting electrons to the floating gate.

The voltage supplying circuit 130 generates the operation voltages V1, V2, Verase, Vpgm, Vread, Vpass, Vdsl, Vssl and Vcsl for the program loop operation, the erase loop operation, the read operation and the electron injection operation of the memory cells, in response to the voltage control signal V_CMD of the control circuit 120. The voltage supplying circuit 130 outputs selectively operation voltages to the local lines SSL, WL0~WLn and DSL and the common source line CSL of the selected memory block, in response to the row address signal of the control signal 120.

The voltage supplying circuit 130 includes a voltage generation circuit (not shown) and a row decoder (not shown). The voltage generation circuit generates the operation voltages V1, V2, Verase, Vpgm, Vread, Vpass, Vdsl, Vssl and Vcsl in response to the voltage control signal V_CMD of the control circuit 120. The row decoder delivers the operation voltages V1, V2, Verase, Vpgm, Vread, Vpass, Vdsl, Vssl and Vcsl to the local lines SSL, WL0~WLn and DSL and the common source line CSL of the memory block selected from the memory blocks 110MB, in response to the row address signal of the control circuit 120.

Output and variation of the operation voltages V1, V2, Verase, Vpgm, Vread, Vpass, Vdsl, Vssl and Vcsl are performed by the voltage supplying circuit 130 according to the voltage control signal V_CMD of the control circuit 120, which will be described below.

The read/write circuit 140 is coupled to the memory array 110 through the bit lines BL. In the program operation, the read/write circuit 140 precharges selectively the bit lines BL according to the control signal RW_CMD of the control circuit 120 and data DATA to be stored in the memory cells. In the program verification operation or the read operation, the read/write circuit 140 precharges the bit lines BL and latches data read from the memory cell by sensing voltage change or current of the bit lines BL, according to the control signal RW_CMD of the control circuit 120.

Figure 3A:
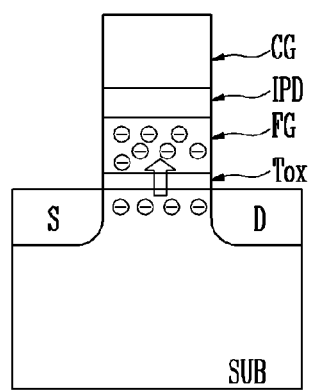
FIG. 3a and FIG. 3b are sectional views of operations of shifting and trapping electrons in the memory cell when the program operation is performed according to one or more embodiments.
Figure 3B:
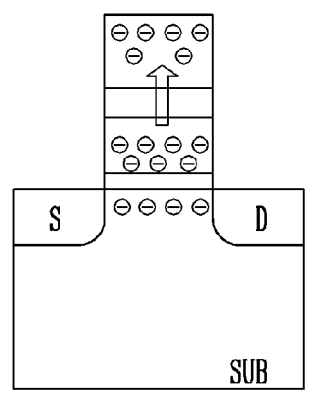

FIG. 3a and FIG. 3b are sectional views of operations of shifting and trapping electrons in the memory cell when the program operation is performed according to one or more embodiments. FIG. 4 is a graph a change of a threshold voltage of the memory cell according to the program voltage according to one or more embodiments.

In FIG. 3a, the memory cell includes a tunnel insulation layer Tox, a floating gate FG, an inter-poly dielectric IPD, a control gate CG, a source S and a drain D. In the event that a program voltage is supplied to the control gate CG in the program operation, electrons are injected into the floating gate FG from a substrate SUB through the tunnel insulation layer Tox. The threshold voltage of the memory cell increases by the electrons injected to the floating gate FG. Data stored in the memory cell is converted from 1 to 0 when the threshold voltage of the memory cell becomes higher than a target level.

In FIG. 3b and FIG. 4, the program voltage should be increased so as to increase the threshold voltage. In the event that the program voltage increases, the electrons injected into the floating gate FG flow to the control gate CG through the inter-poly dielectric IPD. As a result, the threshold voltage of the memory cell does not increase up to a dotted line A1, particularly does not increase any more from a level of a line B1. Accordingly, a method of preventing the flow the electrons injected to the floating gate FG to the control gate CG is required.

Figure 5A:
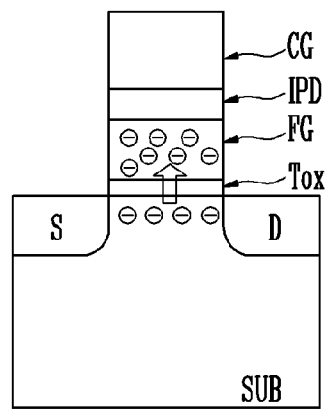
FIG. 5a to FIG. 5c are sectional views of operations of shifting and trapping electrons in the memory cell when the electron injection operation is performed according to one or more embodiments.
Figure 5B:
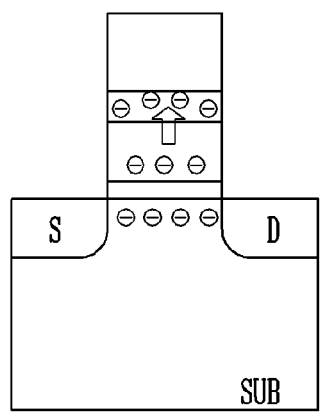
Figure 5C:
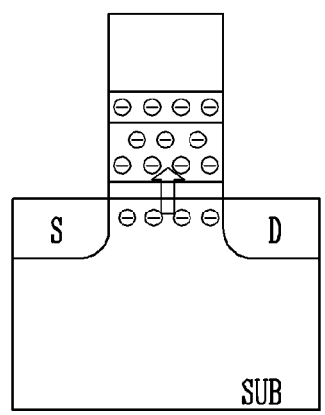
Figure 6:
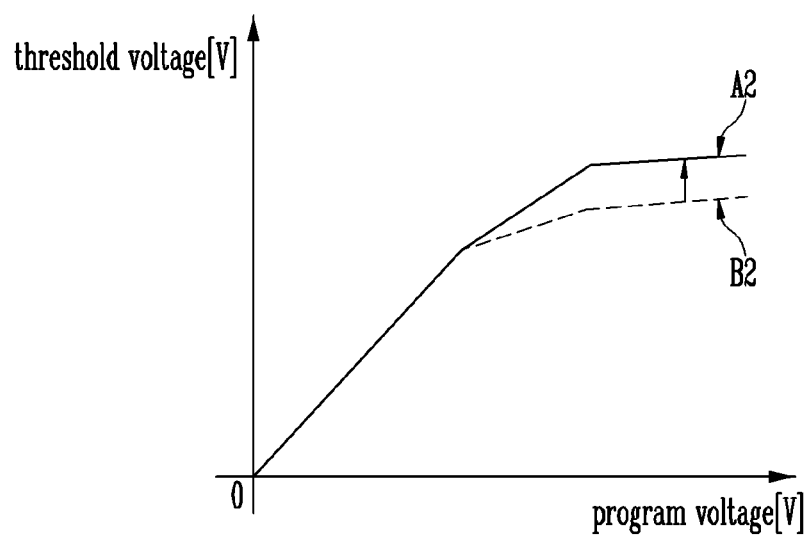
FIG. 6 is a graph of a change of a threshold voltage of the memory cell according to the electron injection operation according to one or more embodiments.

FIG. 5a to FIG. 5c are sectional views of operations of shifting and trapping electrons in the memory cell when the electron injection operation is performed according to one or more embodiments. FIG. 6 is a graph of a change of a threshold voltage of the memory cell according to the electron injection operation according to one or more embodiments.

In FIG. 5a, a first voltage is supplied to a selected word line and word lines adjacent to the selected word line. Here, the first voltage corresponds to a program voltage or an erase voltage. Electrons are injected to the floating gate FG according to the first voltage supplied to the control gate CG. A threshold voltage of the memory cell increases and data stored in the memory cell is altered according to the electrons injected to the floating gate FG. Accordingly, setting an operation condition for injecting the electrons to the floating gate FG is in a range where the data stored in the memory cell is not altered.

In FIG. 5b, the first voltage supplied to the word lines adjacent to the selected word line is decreased to a second voltage. As a result, voltage difference between the control gate CG and the floating gate FG of the memory cell coupled to the selected word line increases by a capacitive coupling phenomenon. The electrons injected into the floating gate FG are trapped in the inter-poly dielectric IPD, by high voltage difference. In this instance, levels of the first voltage and the second voltage supplied to the word lines and a period for which the voltages are applied are controlled, so that the electrons injected into the floating gate FG does not flow through the inter-poly dielectric IPD and are trapped in the inter-poly dielectric IPD.

The inter-poly dielectric IPD is formed by stacking an oxide layer, a nitride layer and an oxide layer. Here, a high dielectric insulation layer, e.g. aluminum oxide layer is used instead of the oxide layer, dielectric constant of the high dielectric insulation layer being higher than that of the oxide layer. The electrons are trapped in the nitride layer of the inter-poly dielectric IPD, according to the electron injection operation.

In FIG. 5c and FIG. 6, the program operation is performed by supplying the program voltage to the selected word line after the electron injection operation is completed. The electrons trapped in the inter-poly dielectric IPD by the electron injection operation prevent the electrons injected into the floating gate FG from being shifted to the control gate CG, in the program operation. That is, the electrons injected into the floating gate FG do not flow through the inter-poly dielectric IPD by the electrons trapped by the inter-poly dielectric IPD. Since the electrons trapped in the inter-poly dielectric IPD by the electron injection operation cut off leakage current from the floating gate FG to the control gate CG, the threshold voltage of the memory cell increases up to a level of a line A2 above the dotted line B2.

Hereinafter, the electron injection operation will be described in detail.

FIG. 7a to FIG. 7c are views of an electron injection operation of memory cells according to some embodiments. FIG. 9 is a view of a waveform of voltages supplied to the word lines in the electron injection operation according to some embodiments.

In FIG. 7a and FIG. 9, a first voltage V1 is supplied to a first word line WL0 and a word line WL1 adjacent to the first word line WL0, during a first interval T1. Here, the first voltage V1 is 15V to 20V, and the first voltage V1 corresponds to the program voltage Vpgm supplied to the memory cell in the program operation. Electrons are injected into the floating gate FG of the memory cell of the first word line WL0 by the first voltage V1, as shown in FIG. 5a. In this instance, the electrons are injected into the floating gate FG only until data stored in the memory cell is not altered.

Subsequently, the first voltage V1 supplied to the word line WL1 adjacent to the first word line WL0 is decreased to a second voltage V2, during a second interval T2. Here, the second voltage V2 is 7V to 12V, and the second voltage V2 corresponds to a program pass voltage supplied to unselected word lines in the program operation. In the event that the first voltage V1 supplied to the word line WL1 is decreased to the second voltage V2, a voltage of the floating gate FG of the first word line WL0 is decreased by the capacitive coupling phenomenon. As a result, a voltage difference between the floating gate FG and the control gate CG of the memory cell of the first word line WL0 increases, and electrons in the floating gate FG are trapped in the inter-poly dielectric IPD by the increased voltage difference.

Next, voltages V1 and V2 are supplied to the first word line WL0 and the word line WL1 adjacent to the first word line WL0 are discharged. As a result, the electron injection operation of the memory cells coupled to the first word line WL0 is completed. When the electron injection operation is performed, a ground voltage 0V is supplied to the bit line BL, a supply voltage Vcc is supplied to the drain select line DSL, the ground voltage 0V is supplied to the source select line SSL, and the supply voltage Vcc is supplied to the common source line CSL.

In FIG. 7b and FIG. 9, the first voltage V1 is supplied to the word line WL1 and word lines WL0 and WL2 adjacent to the second word line WL1, during the first interval T1. Subsequently, the first voltage V1 supplied to the word lines WL0 and WL2 is decreased to a second voltage V2, during the second interval T2. Then, the voltages V1 and V2 supplied to the second word line WL1 and the word lines WL0 and WL2 adjacent to the second word line WL1 are discharged. As a result, the electron injection operation of the memory cells coupled to the second word line WL1 is completed.

In FIG. 7c and FIG. 9, the electron injection operation coupled to a final word line WLn is performed through the method described above. As a result, the electron injection operation of the memory cells included in the memory block is completed.

FIG. 8a and FIG. 8b are views of an electron injection operation of memory cells according to some embodiments In FIG. 8a and FIG. 9, a first voltage V1 is supplied to word lines WL0~WLn of a selected memory block, during a first interval T1. Subsequently, in the event that even-numbered word lines WL0, WL2, WL4 and WLn−1 are selected, the first voltage V1 supplied to odd-numbered word lines WL1, WL3, WL5, WLn−2 and WLn is decreased to a second voltage V2 during a second interval T2. Next, the voltages V1 and V2 supplied to the word lines WL0~WLn are discharged. As a result, the electron injection operation of memory cells coupled to the even-numbered word lines WL0, WL2, WL4 and WLn−1 is completed.

In FIG. 8b and FIG. 9, the first voltage V1 is supplied to the word lines WL0~WLn of the selected memory block, during the first interval T1. Subsequently, in the event that the odd-numbered word lines WL1, WL3, WL5, WLn−2 and WLn are selected, the first voltage V1 supplied to the even-numbered word lines WL0, WL2, WL4 and WLn−1 is decreased to the second voltage V2 during the second interval T2. Next, the voltages V1 and V2 supplied to the word lines WL0~WLn are discharged. As a result, the electron injection operation of memory cells coupled to the odd-numbered word lines WL1, WL3, WL5, WLn−2 and WLn is completed.

The electron injection operation of the memory cells coupled to the even-numbered word lines WL0, WL2, WL4 and WLn−1 and the odd-numbered word lines WL1, WL3, WL5, WLn−2 and WLn is performed, and thus every electron injection operation of the memory cells included in the memory block is completed.

Hereinafter, methods of setting properly a time point at which the electron injection operation starts will be described in detail.

Figure 10A:
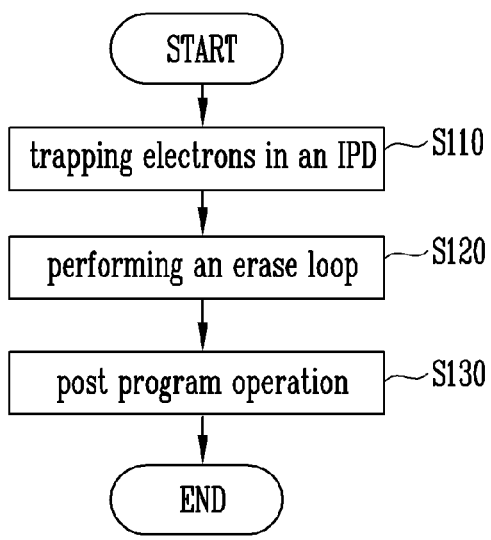
FIG. 10a and FIG. 10b are flowcharts of a method of operating a semiconductor device according to some embodiment
Figure 10B:
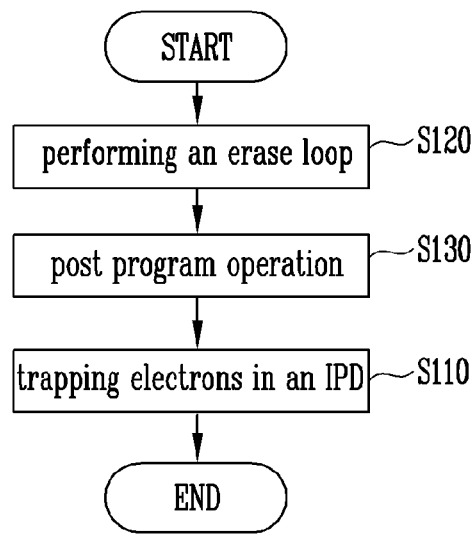

FIG. 10a and FIG. 10b are flowcharts of a method of operating a semiconductor device according to some embodiments Referring to FIG. 10a, an electron injection operation is performed before an erase loop operation is performed.

In step S110, the electron injection operation of trapping electrons in the inter-poly dielectric of memory cells in the selected memory block is performed. The electron injection operation is executed through the embodiments described above.

In step S120, an erase loop operation of the selected memory block is performed. In this instance, each of the electrons injected into the floating gate by the electron injection operation is discharged to the substrate through the tunnel insulation layer. However, since the thickness of the oxide layer of the inter-poly dielectric IPD located between the nitride layer of the inter-poly dielectric IPD and the floating gate is higher than that of the tunnel insulation layer, the electrons trapped in the inter-poly dielectric are not discharged to the floating gate but are kept in the inter-poly dielectric IPD.

In step S130, a post program operation is performed, to narrow threshold voltage distribution of erased memory cells and increase a threshold voltage of excessively erased memory cells up to a desired level.

Referring to FIG. 10b, the electron injection operation is performed before the program loop operation is performed after the erase loop operation is performed.

In the step S120, the erase loop operation is performed to erase data stored in the memory cells of the selected memory block.

In the step S130, the post program operation is performed, to narrow a threshold voltage distribution of the erased memory cells and increase a threshold voltage of excessively erased memory cells up to a desired level.

Subsequently, the electron injection operation is performed to trap the electrons in the inter-poly dielectric IPD of memory cells in the selected memory block in the step S110.

In some embodiments, the electron injection operation in the step S110 is performed before the post program operation in the step S130 is performed.

Figure 11A:
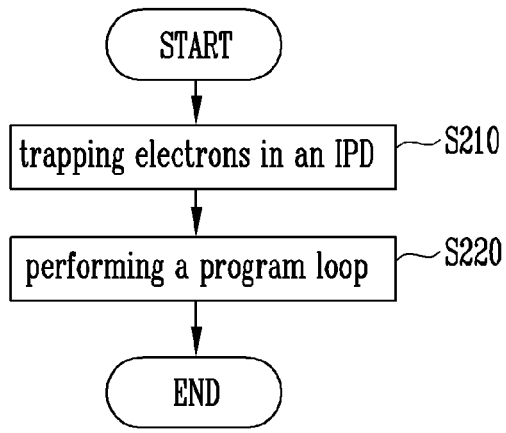
FIG. 11a to FIG. 11c are flowcharts of a method of operating a semiconductor device according to some embodiments
Figure 11B:
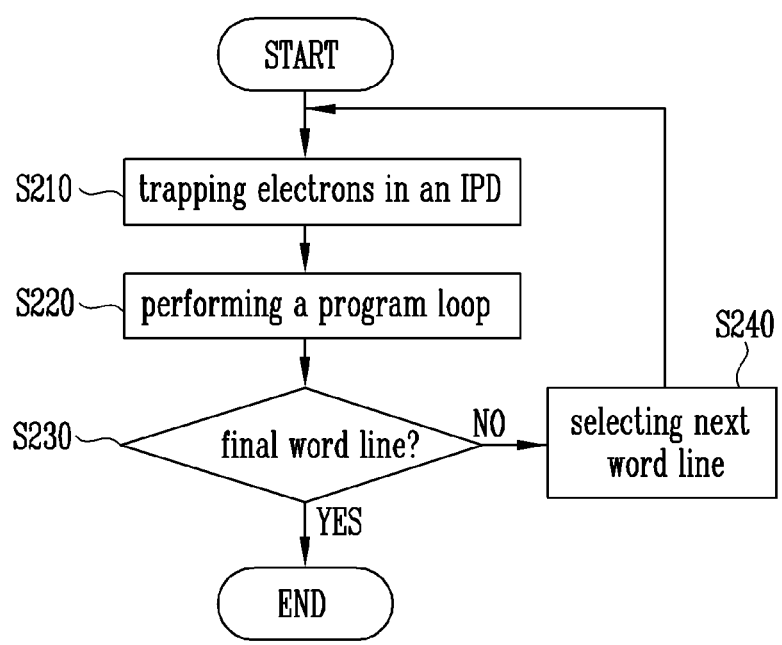
Figure 11C:
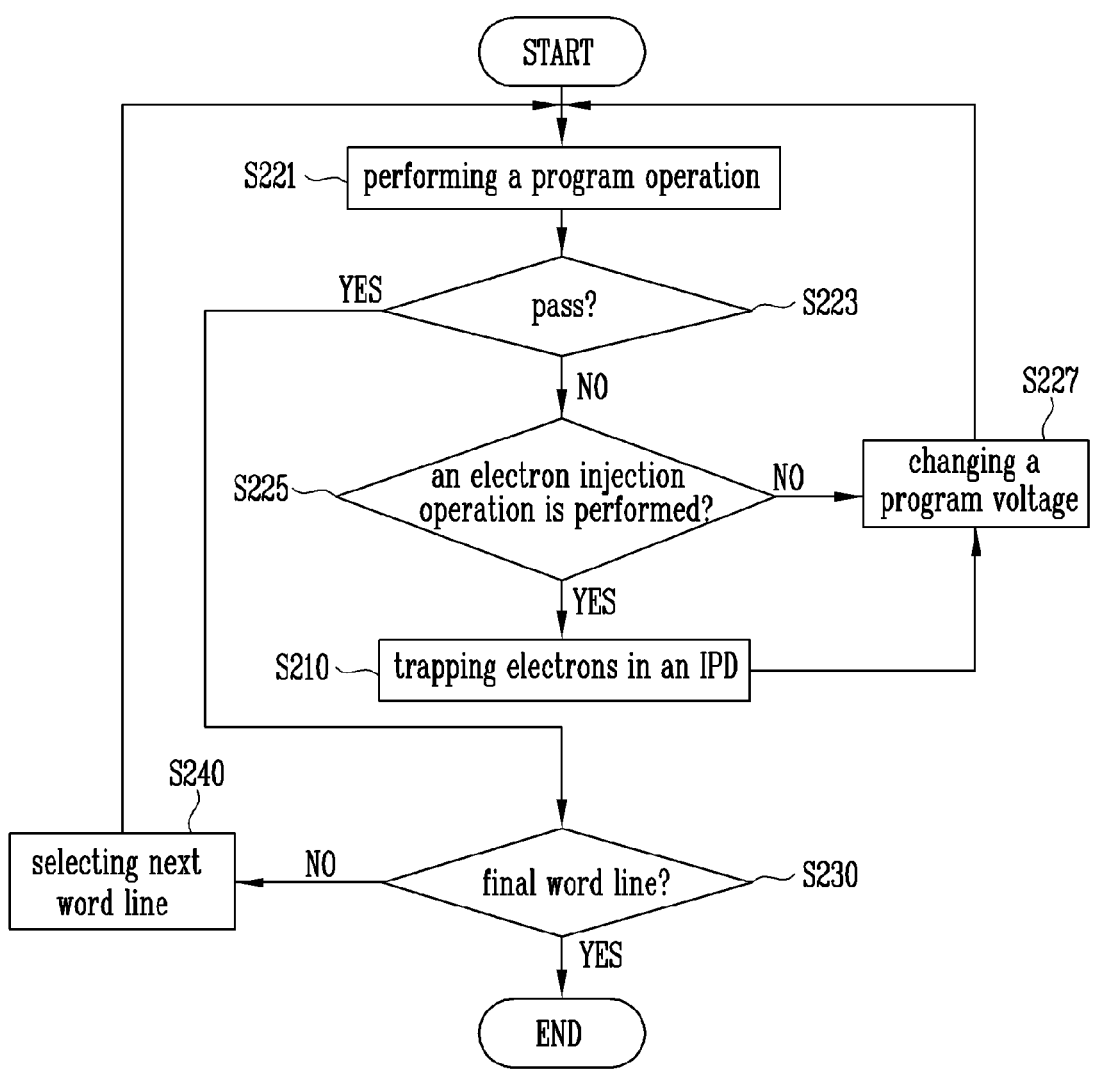

FIG. 11a to FIG. 11c are flowcharts of a method of operating a semiconductor device according to some embodiments In FIG. 11a, an electron injection operation of every memory cell in the memory block is performed, and then a program loop operation of memory cells coupled to a first word line of the memory block is performed.

In step S210, the electron injection operation is performed to trap electrons in an inter-poly dielectric of memory cells in a selected memory block. The electron injection operation is executed based on the embodiments described above.

In step S220, after the electron injection operation of every memory cell in the memory block is completed, program loop operations are sequentially performed in an order from memory cells coupled to the first word line of the memory block to memory cells coupled to a final word line.

In FIG. 11b, the electron injection operation of memory cells coupled to a word line selected from word lines of the memory block is performed, before a program loop operation of the memory cells coupled to the selected word line is performed. That is, in the event that a program loop operation of previous word line is completed and next word line is selected, an electron injection operation of memory cells coupled to the next word line is performed before a program loop operation of the next word line is performed. The electron injection operation is performed whenever the word line is altered.

In the step S210, in the event that the first word line of the memory block is selected, an electron injection operation, of trapping electrons in an inter-poly dielectric of the memory cells coupled to the first word line, is performed. The electron injection operation is executed based on the embodiments described above.

In the step S220, a program loop operation of the first word line is performed.

In the event that the program loop operation of the first word line is completed, whether the word line of which the program loop operation is completed is the final word line in step S230 is detected.

In the event that the word line of which the program loop operation is completed is not the final word line, next word line is selected in step S240. In some embodiments, the next word line is a second word line.

In the event that the second word line is selected, an electron injection operation, of trapping electrons in an inter-poly dielectric of the memory cells coupled to the second word line, is performed in the step S210.

A program loop operation of the second word is performed in the step S220, and whether the word line of which the program loop operation is completed is the final word line in the step S230 is detected.

The steps S210 to S240 are repetitively performed, and the program loop operation of the memory block is finished in the event that a program loop operation of the final word line is completed.

In FIG. 11c, a program operation and a program verification operation are repetitively performed with increasing a program voltage until a threshold voltage of the memory cells reaches a target level, if the program loop operation uses an increment step pulse programming (ISPP) method. In the event that the program voltage supplied to the selected word line becomes higher than a reference voltage, an electron injection operation of the memory cells coupled to the selected word line is performed. This is as follows.

In step S221, a program operation of the memory cells coupled to the first word line of the memory block is performed in the event that the first word line is selected.

In step S223, it is determined whether the program operation is passed, by comparing a threshold voltage of the memory cells of which the program operation is performed with the target level.

The program operation is determined as being failed in the event that the threshold voltage of the memory cell is lower than the target level, and thus whether the electron injection operation is performed in step S225 is determined. Particularly, in the event that the program voltage supplied to the selected word line is higher than the reference voltage is determined, the electron injection operation, of trapping the electrons in the inter-poly dielectric, is performed. The electron injection operation is executed based on the embodiments described above, preferably be executed through the methods described in FIG. 7a to FIG. 7c.

In the event that the program voltage is not higher than the reference voltage, the electron injection operation is not performed but a program voltage is changed in step S227. In the step S227, the program voltage increases by preset level.

The steps S221, S223, S225 and S227 are iteratively performed until the program operation is passed because the threshold voltage of the memory cell becomes higher than the target level.

However, in the event that the electron injection operation is performed though the program voltage is detected as being higher than the reference voltage in the step S225, the electron injection operation is not more performed and the program voltage is changed in the step S227. That is, the electron injection operation is performed for respective word lines only by one time.

In the event that the program loop operation S221, S223, S225 and S227 of the first word line is completed, whether the word line of which the program loop operation is completed is the final word line is detected. In the event that the word line is not the final word line, next word line, e.g. a second word line is selected in the step S240 and the steps S221, S223, S225, S227 and S210 are iteratively performed. In the event that the program loop operation of the final word line is completed through the above method, the program loop operation of the memory block is finished.

Figure 12:
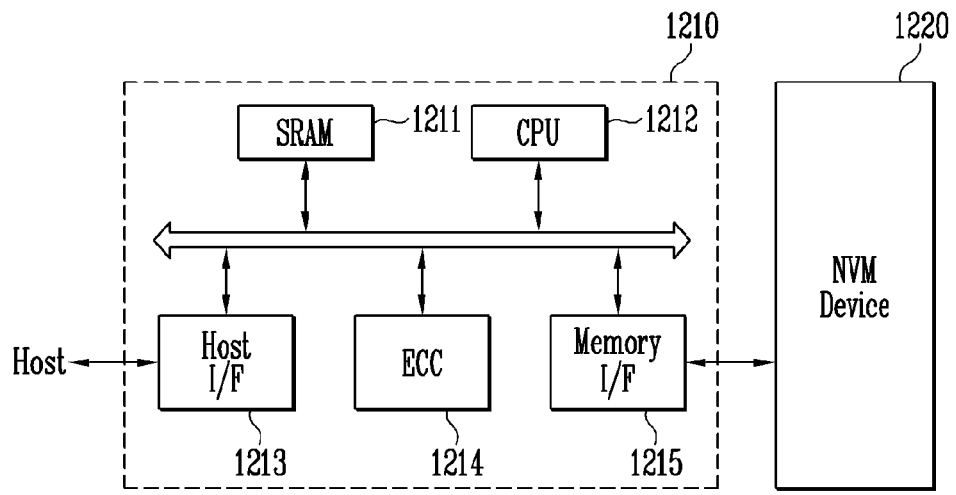
FIG. 12 is a block diagram of schematically a memory system according to some embodiments.

FIG. 12 is a block diagram of schematically a memory system according to some embodiments.

In FIG. 12, the memory system 1200 of the present embodiment includes a non-volatile memory device 1220 and a memory controller 1210.

The non-volatile memory device 1220 is the semiconductor device described above. The memory controller 1210 controls the non-volatile memory device 1220. The memory system 1200 is used as a memory card or a solid state disk SSD by combination of the non-volatile memory device 1220 and the memory controller 1210. An SRAM 1211 is used as an operation memory of a processing unit 1212. A host interface 1213 has data exchange protocol of a host accessed to the memory system 1200. An error correction block 1214 detects and corrects error of data read from the non-volatile memory device 1220. A memory interface 1215 interfaces with the non-volatile memory device 1220 The processing unit 1212 performs control operation for data exchange of the memory controller 1210.

The memory system 1200 further includes a ROM (not shown) for storing code data for interfacing with the host and so on. The non-volatile memory device 1220 is provided as multi-chip package including flash memory chips. The memory system 1200 is provided as high-reliable storage medium having low error possibility. Specially, the flash memory device is included in the SSD studied actively in recent. In this case, the memory controller 1210 communicates with an external device, e.g. host through one of various interface protocols such as USB, MMC, PCI-E, SATA, PATA, SCSI, ESDI, IDE, etc.

Figure 13:
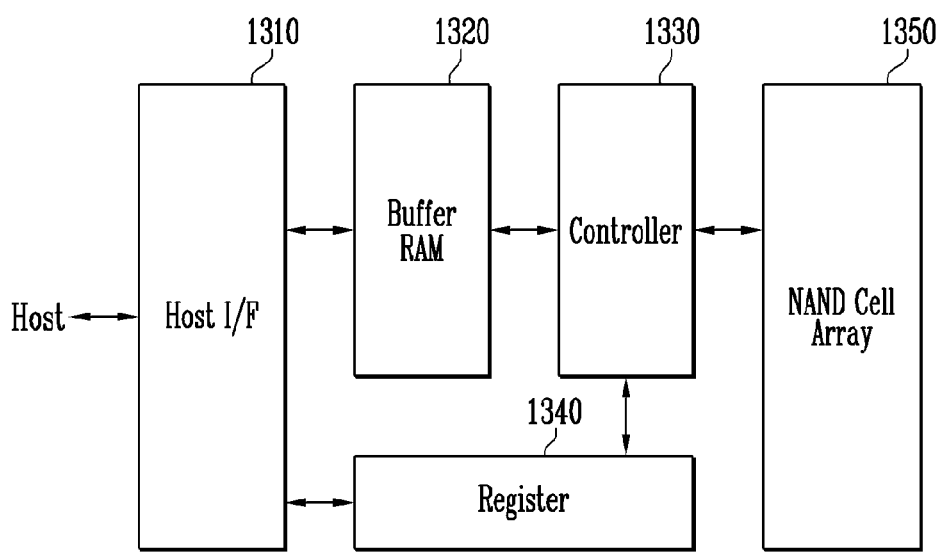
FIG. 13 is a block diagram of schematically a fusion memory device or a fusion memory system for performing a program operation.

FIG. 13 is a block diagram of schematically a fusion memory device or a fusion memory system for performing a program operation. Some embodiments are applied to a OneNAND flash memory device 1300 as a fusion memory device.

The OneNAND flash memory device 1300 includes a host interface 1310 for exchanging information with a device using different protocol, a buffer RAM 1320 for embedding code for driving the memory device or storing temporarily data, a controller 1330 for controlling reading, programming and every state in response to a control signal and a command inputted from an outside device, a register 1340 for storing data such as configuration for defining command, address, system operation environment in the memory device, and a NAND flash cell array 1350 having operation circuit including a non-volatile memory cell and a page buffer. The OneNAND flash memory device programs data through common program method in response to a write command provided from a host.

Figure 14:
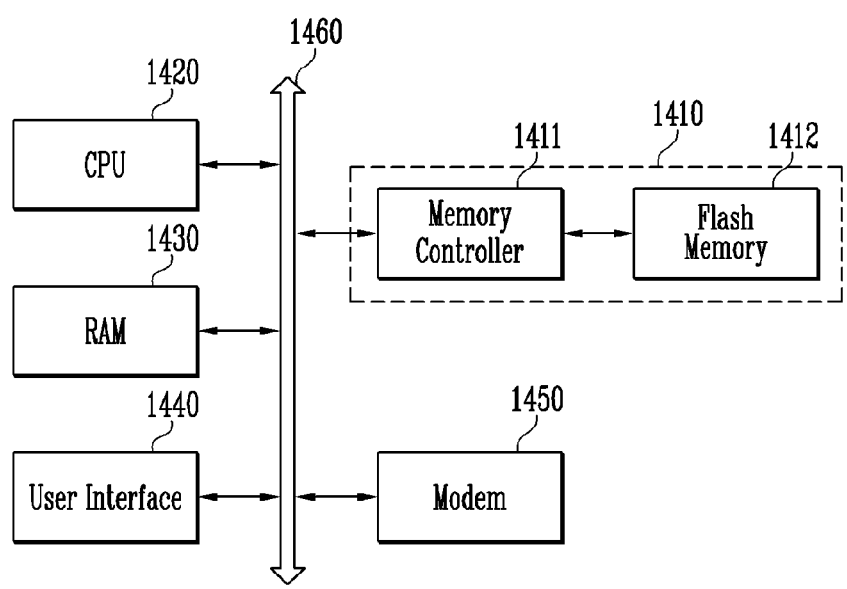
FIG. 14 is a view of schematically a computing system including a flash memory device according to some embodiments

FIG. 14 is a view a schematically a computing system including a flash memory device according to some embodiments The computing system 1400 includes a microprocessor 1420 connected electrically to a system bus 1460, a RAM 1430, a user interface 1440, a modem 1450 such as a baseband chipset, and a memory system 1410. In the event that the computing system 1400 is a mobile device, a battery (not shown) for supplying an operation voltage to the computing system 1400 is further provided. The computing system 1400 further includes an application chipset, a camera image processor CIS, a mobile DRAM, etc., which are shown. The memory system 1410 includes an SSD using for example a non-volatile memory for storing data. The memory system 1410 is applied to a fusion flash memory, e.g. OneNAND flash memory.

Although embodiments have been described with reference to a number of illustrative embodiments thereof, it should be understood that numerous other modifications and embodiments can be devised by those skilled in the art that will fall within the spirit and scope of the principles of this disclosure.

The invention claimed is:

1. A method of operating a semiconductor device, the method comprising:
    performing an erase loop operation of a memory cell in a memory block, the memory cell comprising a floating gate, an inter-poly dielectric and a control gate;
    performing an electron injection operation of trapping electrons in the inter-poly dielectric of the memory cell; and
    performing a program loop operation of memory cells coupled to a word line selected from the memory block.

2. The method of claim 1, wherein the electron injection operation is performed before the erase loop operation.

3. The method of claim 1, wherein the electron injection operation is performed before the program loop operation and after the erase loop operation.

4. The method of claim 1, wherein the program loop operation of memory cells coupled to a first word line of the memory block is performed after the electron injection operation of every memory cell in the memory block is performed.

5. The method of claim 1, wherein performing the electron injection comprises trapping the electrons in the inter-poly dielectric of the memory cells coupled to a selected word line, and the electron injection operation is performed before the program loop operation of the memory cells coupled to the selected word line is performed.

6. The method of claim 1, wherein the program loop operation of the memory cells is iteratively performed through an increment step pulse programming (ISPP) method, and the electron injection operation of the memory cells coupled to the selected word line is performed in the event that a program voltage supplied to the selected word line is higher than a reference voltage.

7. The method of claim 1, wherein in the electron injection operation, a first voltage is supplied to the selected word line, and the first voltage is supplied to word lines adjacent to the selected word line and then a second voltage lower than the first voltage is supplied to the word lines adjacent to the selected word line.

8. The method of claim 7, wherein the first voltage corresponds to a program voltage supplied to the selected word line, and the second voltage corresponds to a program pass voltage supplied to unselected word lines.

9. The method of claim 1, wherein the electron injection operation comprises:
supplying a first voltage to all word lines and decreasing the first voltage supplied to odd-numbered word lines to a second voltage during a first operation; and
supplying the first voltage to all the word lines and decreasing the first voltage supplied to even-numbered word lines to the second voltage during a second operation different from the first operation.

10. A semiconductor device comprising:
a memory block comprising memory cells coupled to word lines, wherein the memory cell comprises a floating gate, an inter-poly dielectric and a control gate; and
a peripheral circuit configured to perform an erase loop operation, a program loop operation, and an electron injection operation of the memory cell, the electron injection operation trapping electrons in the inter-poly dielectric.

11. The semiconductor device of claim 10, wherein the peripheral circuit is configured to perform the electron injection operation before the erase loop operation.

12. The semiconductor device of claim 10, wherein the peripheral circuit is configured to perform the electron injection operation before the program loop operation and after the erase loop operation.

13. The semiconductor device of claim 10, wherein the peripheral circuit is configured to perform the program loop operation of memory cells coupled to a first word line of the memory block after the electron injection operation of every memory cell in the memory block.

14. The semiconductor device of claim 10, wherein the peripheral circuit is configured to perform the electron injection operation of the memory cells coupled to the selected word line, before the program loop operation of the memory cells coupled to the selected word line of word lines of the memory block.

15. The semiconductor device of claim 10, wherein the peripheral circuit is configured to perform the program loop operation of the memory cells through an increment step pulse programming (ISPP) method, and to perform the electron injection operation of the memory cells coupled to the selected word line in the event that a program voltage supplied to the selected word line is higher than a reference voltage.

16. The semiconductor device of claim 10, wherein in the electron injection operation, the peripheral circuit is configured to supply a first voltage to the selected word line and word lines adjacent to the selected word line, and then decrease the first voltage supplied to the word lines adjacent to the selected word line to a second voltage.

17. The semiconductor device of claim 15, wherein the first voltage corresponds to a program voltage supplied to the selected word line in the program loop operation, and the second voltage corresponds to a program pass voltage supplied to unselected word lines.

18. The semiconductor device of claim 10, wherein the peripheral circuit is configured to supply a first voltage to word lines and then decrease the first voltage supplied to odd-numbered word lines to a second voltage, to trap the electrons in the inter-poly dielectric of memory cells coupled to even-numbered word lines during a first operation, and
supply the first voltage to the word lines and then decreases the first voltage supplied to the even-numbered word lines to the second voltage, to trap the electrons in the inter-poly dielectric of memory cells coupled to the odd-numbered word lines during a second operation different from the first operation.

* * * * *